(12) United States Patent
Vladan

(10) Patent No.: US 9,438,430 B2
(45) Date of Patent: Sep. 6, 2016

(54) SYSTEM AND METHOD FOR MEASURING CURRENT IN HYBRID POWER OVER ETHERNET ARCHITECTURE

(75) Inventor: Marius Ionel Vladan, Oudenaarde (BE)

(73) Assignee: Broadcom Corporation, Irvine, CA (US)

( * ) Notice: Subject to any disclaimer, the term of this patent is extended or adjusted under 35 U.S.C. 154(b) by 1198 days.

(21) Appl. No.: 13/336,854

(22) Filed: Dec. 23, 2011

(65) Prior Publication Data

US 2013/0166236 A1    Jun. 27, 2013

(51) Int. Cl.
 *G01R 19/00*  (2006.01)
 *G06F 1/00*  (2006.01)
 *H04L 12/10*  (2006.01)
 *G06F 1/26*  (2006.01)

(52) U.S. Cl.
 CPC .............. *H04L 12/10* (2013.01); *G06F 1/266* (2013.01); *G01R 19/0092* (2013.01)

(58) Field of Classification Search
 CPC .. G01R 21/133; G01R 27/00; G01R 27/162; G01R 19/0038; G01R 19/0092; G01R 19/2513
 USPC .......................... 702/64; 324/713, 74; 327/53
 See application file for complete search history.

(56) References Cited

U.S. PATENT DOCUMENTS

| | | | |
|---|---|---|---|
| 7,576,526 B2* | 8/2009 | Kimura | 323/277 |
| 7,627,398 B1* | 12/2009 | Bennett et al. | 700/286 |
| 2003/0080759 A1* | 5/2003 | Kunst et al. | 324/713 |
| 2004/0155662 A1* | 8/2004 | Graf | G01R 19/0092 324/522 |
| 2009/0129438 A1* | 5/2009 | Pan | 374/170 |
| 2010/0079120 A1* | 4/2010 | Arndt | 323/269 |
| 2010/0134086 A1* | 6/2010 | Theil et al. | 323/312 |

* cited by examiner

*Primary Examiner* — Mischita Henson
*Assistant Examiner* — Christine Liao
(74) *Attorney, Agent, or Firm* — Sterne, Kessler, Goldstein & Fox P.L.L.C.

(57) ABSTRACT

Systems and methods of measuring current in a power over Ethernet (PoE) system are provided. The PoE system includes an integrated circuit component having a controller, an internal transistor, a replica transistor, and an external transistor. Current in the system can be indirectly measured by enabling and disabling the transistors in known ways and then measuring the current through the replica transistor. The actual current in the system can be calculated based on the measured currents, thereby allowing for a PoE system that is capable of measuring current without a resistor in series with the external transistor.

17 Claims, 9 Drawing Sheets

Initial
Internal Transistor Enabled
External Transistor Enabled

Final
Internal Transistor Disabled
External Transistor Enabled

SYSTEM AND METHOD FOR MEASURING CURRENT IN HYBRID POWER OVER ETHERNET ARCHITECTURE

BACKGROUND

1. Field of the Invention

The invention relates to systems and methods of indirectly measuring the current in hybrid power over ethernet (PoE) architectures without the use of an external series resistor.

2. Related Art

Power over Ethernet (PoE) has become a popular method of delivering power to devices distributed over a network. Compared to the traditional AC power distribution networks, PoE allows for increased efficiency, the ability to provide DC power to devices that require DC power directly and without the need to convert from AC, and the elimination of the need for separate power and data plugs. PoE systems, in general, are well known and are described, for instance, in the IEEE 802.3f and 802.3at specifications, which is incorporated herein by reference in its entirety.

In most PoE systems, power sourcing equipment (PSE) delivers power to one or more powered devices (PDs) over ethernet cabling. Various common PDs include VoIP devices, wireless LAN access ports, Bluetooth access points, network cameras, computing devices, etc. PSEs provide power to the various PDs by turning on transistors (commonly field effect transistors) to allow current to flow to the PD load. It is not uncommon for PSEs to include an integrated circuit component that has an internal transistor to provide current to the load as well as an external transistor that also provides power.

For various reasons, it is frequently desirable to monitor and periodically measure the current flowing through the PSE. For instance, monitoring the current allows the system to detect fluctuations in power usage and adjust to them. In PSEs that employ an external power transistor, this has historically been done by placing a resistive element in series with the external transistor and measuring the voltage drop across the resistor. However, measuring the current this way is inefficient, requires additional components, and results in greater power dissipation.

Thus, there exists a need in the art for systems and methods of measuring the total current in a PSE system that do not require a resistor in series with the external transistor.

BRIEF SUMMARY

Embodiments of the disclosure include systems and methods of indirectly measuring current in a power over Ethernet (PoE) system that includes a first transistor, a second transistor, and a replica transistor. The method includes enabling at least one of the first and second transistors and measuring a first current through the replica transistor. At least one of the first and second transistors can then be disabled and a second current through the replica transistor can be measured. A current factor is then calculated and an actual current based on the first and second measured currents and the current factor is calculated and reported.

According to embodiments, the PoE system includes an integrated circuit component having a controller, a first transistor, and a replica transistor. The first transistor and the replica transistor are coupled between a load and a ground in parallel. A second transistor is directly coupled between a load and a ground and is external to the integrated circuit component. The controller is configured to enable at least one of the first and second transistors to measure a first current though the replica transistor. According to embodiments, the controller may also be configured to disable one of the first and second transistors and to measure a second current through the replica transistor. The controller can then calculate a current factor, $k_f$, and to calculate an actually current in the PoE system based on the first and second measured currents and the current factor $k_f$.

BRIEF DESCRIPTION OF THE DRAWINGS/FIGURES

Embodiments of the disclosure are described with reference to the accompanying drawings. In the drawings, like reference number indicate identical or functionally similar items. Additionally, the left-most digit(s) of a reference number indicates the drawing in which the reference number first appears.

DETAILED DESCRIPTION

Figure 1:
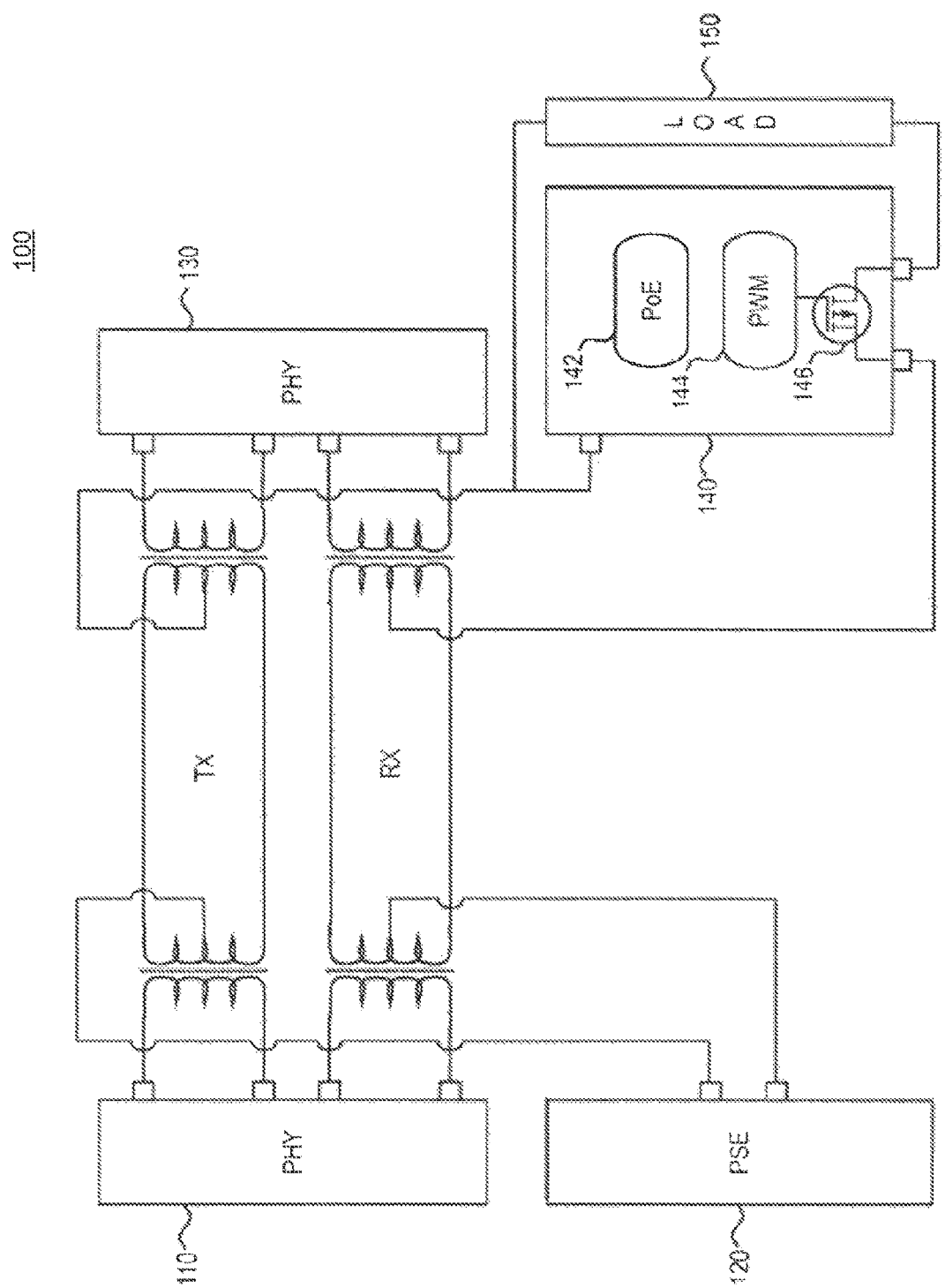
FIG. 1 illustrates a power over Ethernet (PoE) system.

The following detailed description refers to accompanying drawings to illustrate exemplary embodiments consistent with the disclosure. References in the detailed description to "one exemplary embodiment," "an exemplary embodiment," "an example exemplary embodiment," etc., indicate that the exemplary embodiment described may include a particular feature, structure, or characteristic, but every exemplary embodiment may not necessarily include the particular feature, structure, or characteristic. Moreover, such phrases are not necessarily referring to the same exemplary embodiment. Further, when a particular feature, structure, or characteristic is described in connection with an exemplary embodiment, it is within the knowledge of those skilled in the relevant art to affect such a feature, structure, or characteristic in connection with other exemplary embodiments whether or not explicitly described.

The exemplary embodiments described herein are provided for illustrative purposes, and are not limiting. Other exemplary embodiments are possible and modifications may be made to the exemplary embodiments within the spirit and scope of the disclosure. Further, the detailed description is not meant to limit the invention, as the scope of the invention is defined only in accordance with the following claims and their equivalents.

Embodiments of the disclosure may be implemented in hardware, firmware, software, or any combination thereof. Embodiments of the disclosure may also be implemented as instructions stored on a computer-readable medium which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices, and others. Further, firmware, software, routines, and instructions may be described herein as performing certain actions. However, it should be appreciated that such descriptions are merely for convenience and that such actions in fact result from competing devices, processors, controllers or other devices executing the firmware, software, routines, instructions, etc.

The following detailed description of the exemplary embodiments will so fully reveal the general nature of the disclosure that others can, by applying knowledge of those skilled in the relevant arts readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based upon the teaching and guidance presented herein. It is to be understood that the phraseology or terminology herein is for the purpose of description and not of limitation, such that the terminology or phraseology of the present specification is to be interpreted by those skilled in the relevant arts in light of the teachings herein.

FIG. 1 illustrates an embodiment of a Power over Ethernet (PoE) system. As illustrated, the PoE system includes power sourcing equipment (PSE) 120 that transmits power to powered device (PD) 140. Power delivered by PSE 120 to PD 140 is provided through the application of a voltage across the center taps of transformers that are coupled to a transmit (TX) pair and a receive (RX) pair of wires carried within an Ethernet cable. In general, the TX/RX pair can be found in, but not limited to structured cabling. The two TX and RX pairs enable data communication between Ethernet PHYs 110 and 130 in accordance with 10BASE-T, 100BASE-TX, 1000BASE-T, 10 GBASE-T and/or any other layer 2 PHY technology.

As is further illustrated in FIG. 1, PD 140 includes PoE module 142. PoE module 142 includes the electronics that would enable PD 140 to communicate with PSE 120 in accordance with a PoE standard such as IEEE 802.3af, 802.3at, legacy PoE transmission, or any other type of PoE transmission. PD 140 also includes pulse width modulation (PWM) DC:DC controller 144 that controls power FET 146, which in turn provides constant power to load 150.

In the example of the IEEE 802.3af standard, PSE 120 can deliver up to 15.4 W of power to a plurality of PDs (only one PD is shown in FIG. 1 for simplicity). In the IEEE 802.at draft specification, on the other hand, a PSE may be able to deliver up to 30 W of power to a PD over two wire pairs. Other proprietary solutions can potentially deliver even higher levels of power to a PD. Those or even higher levels of power can also be provided to a PD over four wire pairs.

In delivering power to a PD, a PSE fundamentally relies on some control to "turn on" a power FET (power switch), which allows current to be transmitted through it to the PD on the other side of the link. In one example, the power FET is an internal FET, which allows for a high level of integration and lower cost. In one embodiment, an integrated PSE controller would include the microcontroller, power switches, as well as current sense, detection, classification, and disconnect functionality.

In general, internal FETs are advantageous in the efficiencies (e.g., space, power, etc.) that are gained in producing an integrated architecture. These efficiencies are gained due to the optimizations that can be implemented in a higher-level system design. By necessity, these optimizations are targeted at a particular application. For example, a PSE controller can be optimized for a given power level (e.g., 30 W per port in an 802.3at application). A consequence of such optimizations is the loss of flexibility. For example, while an internal FET architecture can be optimized for 30 W per port, this power level can also represent a maximum power limit. Further power applications at higher power levels would therefore be precluded from its designed operation.

In contrast to these integrated architectures, the power F ET can be designed as an external FET. External FETs allow for more flexibility in the maximum power delivery due to variability of the sizing of the external FET. Unfortunately, these designs suffer from higher cost, lower integration and limitations on the PET selection. Furthermore, external FETs often require odd-shaped heatsinks, which can be prohibitive in very high power applications with multiple ports. For these and other reasons, the external FET approach has limitations where space, cost and cooling can be an issue. Accordingly, it can be seen that internal power FET and external power FET architectures each have their associated advantages and disadvantages. However, a hybrid architecture employing both internal and external power transistors can eliminate many of the disadvantages and combine the advantages of the two kinds of architectures.

Figure 2:
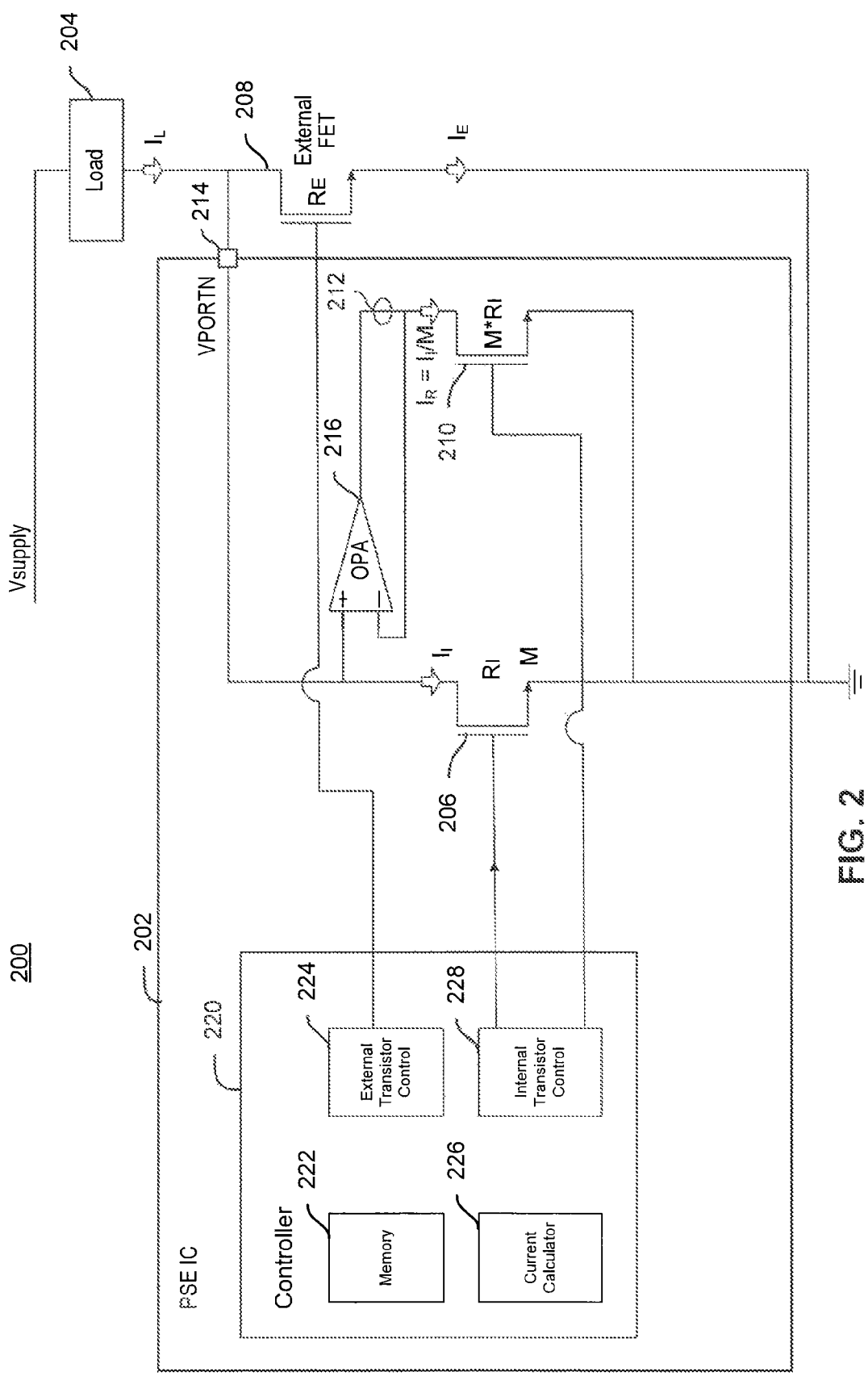
FIG. 2 depicts a functional block diagram of power source equipment (PSE) utilizing an external transistor.

FIG. 2 is a block diagram of power source equipment (PSE) having a hybrid architecture having both an internal transistor and an external transistor according to embodiments of the disclosure. As shown in FIG. 2, the PSE 200 comprises an integrated circuit component 202 and an external transistor 208. Load current flows from the Vsupply through load 204 to both the external transistor 208 and the integrated circuit 202 component.

The integrated circuit 202 comprises an internal transistor 206 and a replica transistor 210. FIG. 2 depicts transistors 206, 208, and 210 generically as FETs, but a person of ordinary skill in the art would understand that any suitable semiconducting device could be used (e.g., MOSFETs, BJTs, JFETs, etc.).

According to embodiments of the disclosure, the integrated circuit 202 may also comprise a controller 220, which controls the operation of the transistors 206, 208, and 210. For instance, if the controller determines that a particular transistor should be enabled, it can cause an appropriate high voltage to be applied to the gate of that transistor, assuming an N-type device. Likewise, if the controller determines that a particular transistor should be disabled, then it can cause an appropriate low voltage or ground to be applied to the gate, assuming an N-type device.

According to various embodiments of the disclosure, the controller 220 may comprise a number of elements including a memory module 222, an external transistor control module 224, a current calculator 226, and an internal transistor control module 228. According to some embodiments, the memory 222 contains computer instructions for executing various control functions. The internal and external transistor control modules 224 and 228 are responsible for providing the control signals that enable and disable the internal transistor 206, the replica transistor 210, and to the external transistor 208. For instance, if FETs are being used, then the external control 224 can provide the gate voltage to external FET 208. Similarly, internal control 228 can provide the gate voltage to internal FET 206 and to the replica transistor 210.

The current calculator module 228 can be configured to calculate the current in the PoE based on one or more current measurements at measurement node 212. The current at node 212 can be measured by any of a number of well-known means. For instance, according to some embodiments, the current is measured by detecting a voltage drop across a known resistive element placed in series with node 212.

According to embodiments, an Operational Amplifier 216 (or any other appropriate voltage replicator circuit) is connected between the internal 206 and replica 210 transistors and serves to mirror the current flowing through internal transistor 206 in replica transistor 210. In one embodiment, preferably the replica transistor 210 is much smaller than either the internal transistor 206 or the external transistor 208 and, accordingly, the current at node 212 is also a fraction of the current flowing through internal transistor 206. Due to the feedback and gain the operational amplifier 216, the inputs will be driven to the same voltage, so that the drain voltage on both the internal transistor 206 and the replica transistor 201 are the same. If equal gate voltages are applied to the internal and replica transistors 206 and 210, then the current flowing through the internal transistor 206 will be mirrored in replica transistor 210, but by a fractional amount.

As shown in FIG. 2, internal transistor 206 has a resistance of $R_I$ and a current associated with it of $I_I$. The replica transistor 210 has a resistance of $R_R$ and a current of $I_R$. According to embodiments, the resistance of the replica transistor 210 is greater than the resistance of the internal transistor 206 by a factor of M. Accordingly, since the op-amp 216 ensures that they have the same voltage at their drains, Ohm's law dictates that the current through the replica transistor 210 will be related to the current in the internal transistor by a factor of $1/M$. That is, $I_R = I_I / M$. Since $I_R$ is smaller than $I_I$, it can be measured with much less power dissipation than if $I_I$ were to be measured directly.

The current drawn by the powered device 140 (generically depicted as load 204 in FIG. 2) is $I_L$. When both the internal transistor 206 and the external transistor 208 are active, the load current $I_L$ equals the sum of current $I_E$ and $I_I$ ($I_L = I_E$ and $I_I$) According to embodiments, the current drawn by the load 204 can be measured indirectly by placing the system in an initial state and measuring an initial state current at measurement node 212 and then placing the system in a final state and measuring a final state current at the measurement node 212. The load current can then be calculated based on these measurements. The initial state and final state measurements can occur in several ways, as discussed below.

Figure 3:
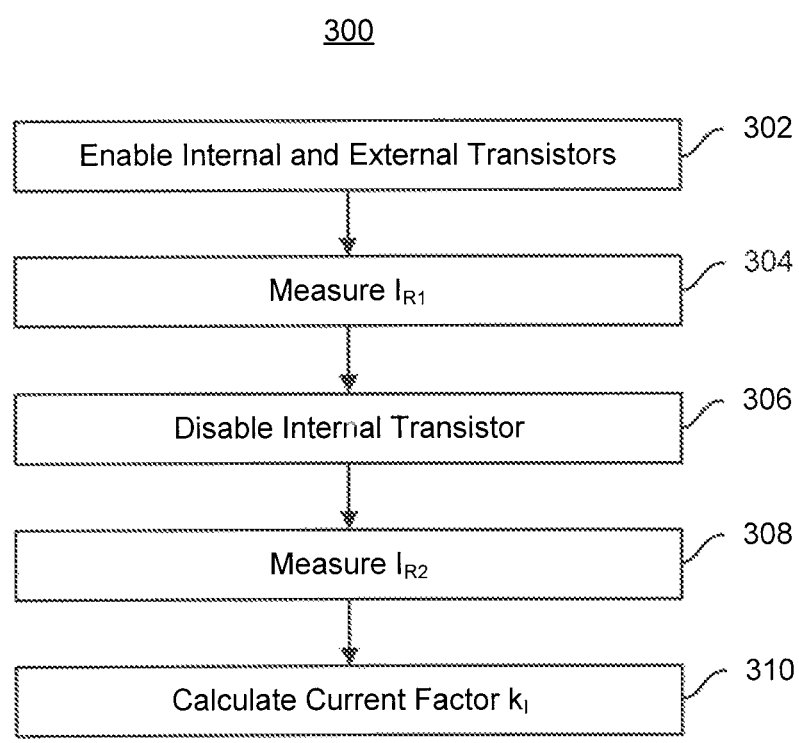
FIG. 3 is a flowchart that illustrates a method of measuring current.
Figure 4:
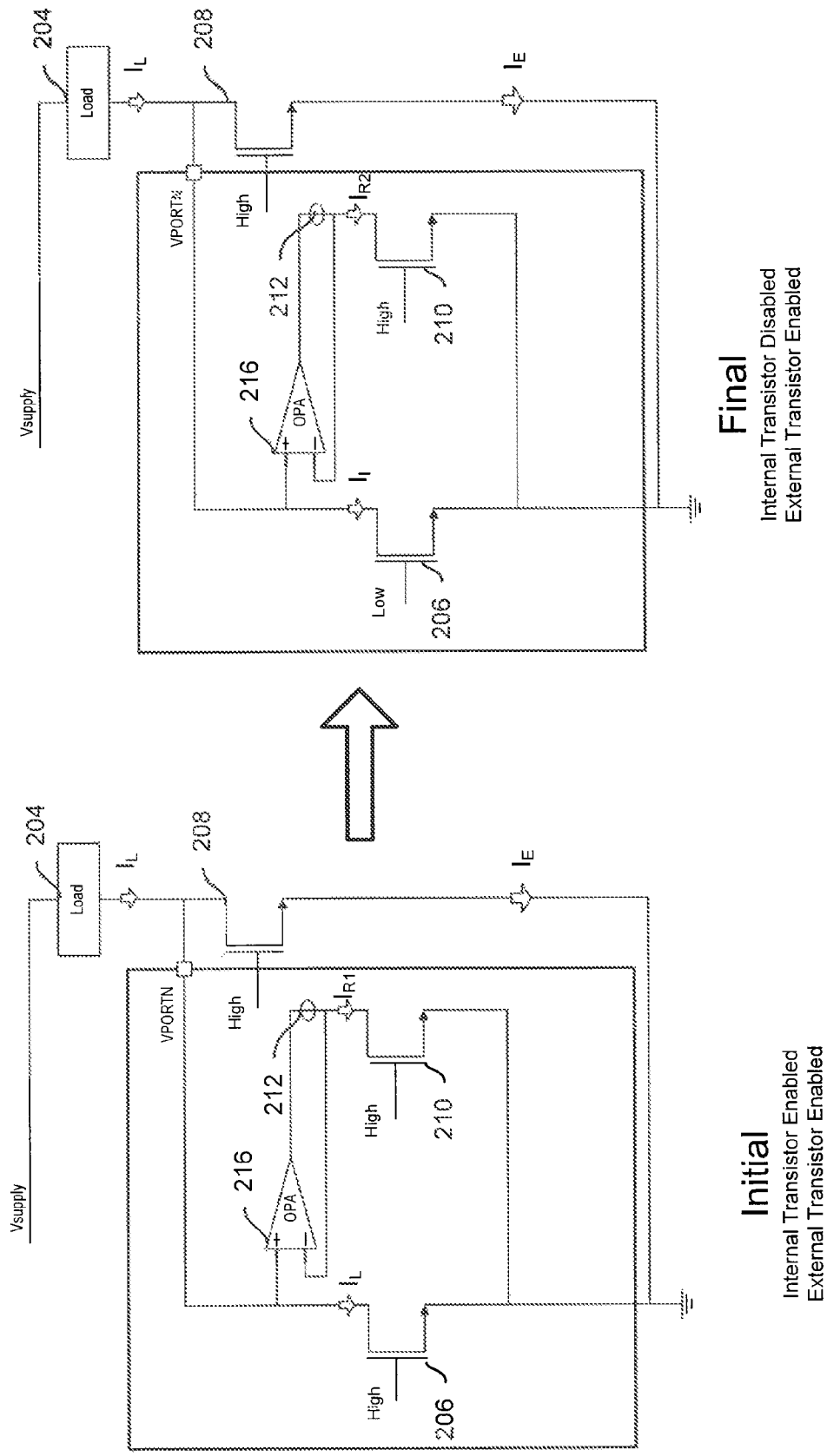
FIG. 4 is a diagram of the states of various circuit components as they operate according to embodiments of the disclosure.

FIG. 3 depicts a method 300 of indirectly measuring the current in a hybrid PoE system according to embodiments of the disclosure. FIG. 4 depicts the state of various components in a hybrid PoE system as it performs the method 300 according to embodiments of the disclosure. The method 300 is described with reference to FIGS. 3 and 4.

As shown in FIG. 3, the method begins by enabling (e.g., turning "ON") both the internal transistor 206 and the external transistor 208 at step 302. As shown in FIG. 4, this initial step can be accomplished by applying a high voltage to the gates of the internal transistor 206 and the external transistor 208. The high gate voltage is provided for the internal transistor 206 and the replica transistor 210 by the internal transistor control 228. Similarly, the high gate voltage is provided to the external transistor 208 by the external transistor control 224. This places the system in its initial state. The current at measurement node 212 can then be measured to acquire an initial current $I_{R1}$ at step 304. Next, at step 306, the internal transistor 206 is disabled but the external transistor is left enabled, thereby placing the system in its final state according to method 300. An initial second current $I_{R2}$ can then be measured at step 308. Next, according to the method, a current factor $k_I$ is calculated based on the following equation, where M is a size factor that relates the relative size of the internal transistor 206 and the replicate transistor 210:

$$k_I = M * \frac{I_{R1}}{I_{R2} - I_{R1}} \qquad \text{Eq. 1}$$

According to embodiments of the present disclosure, current factor $k_I$ can then be used to calculate the load current as discussed in more detail, below.

Figure 5:
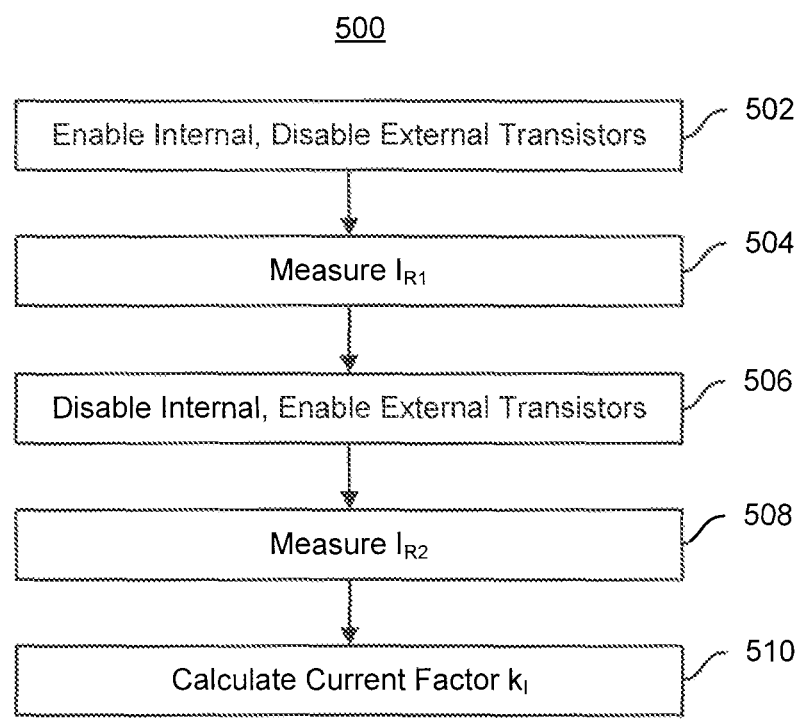
FIG. 5 is a flow chart that illustrates a method of measuring current.
Figure 6:
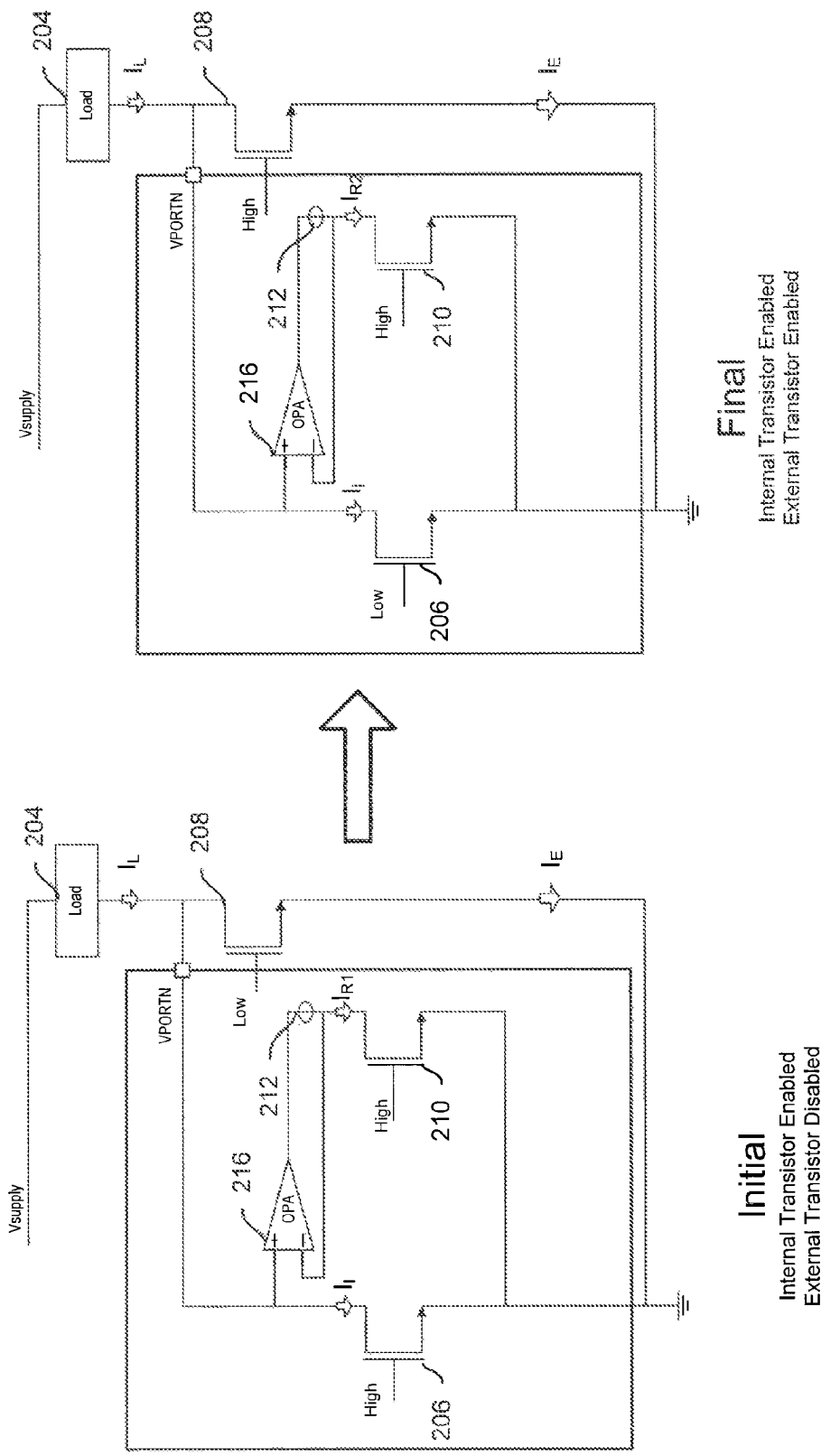
FIG. 6 is a diagram of the states of various circuit components as they operate according to embodiments of the disclosure.

FIG. 5 depicts a method 500 for measuring current according to an alternate embodiment of the disclosure. Method 500 differs from method 300 in that it uses different initial and final states to determine the current factor $k_I$. FIG. 6 depicts the state of various components in a hybrid PoE system as it performs the method 500 according to embodiments of the disclosure.

According to method 500, the controller 220 enables internal transistor 206 and disables external transistor 208 at step 502. The initial-state current $I_{R1}$ at current measurement node 212 can then be measured at step 504. Next, at step 506, the internal transistor 206 is disabled and the external transistor 208 is enabled. According to embodiments of the disclosure, the transistors 206, 208, and 210 can be enabled by applying an appropriate high voltage to their gates and disabled by applying an appropriate low voltage (e.g., ground) to their gates. At step 508, final-state current $I_{R2}$ can be measured. At step 508, a current factor $k_I$ is calculated according to equation 2, below.

$$k_I = M * \frac{I_{R1}}{I_{R2}} \qquad \text{Eq. 2}$$

Again, according to embodiments of the present disclosure, current factor $k_I$ can then be used to calculate the load current as discussed in more detail, below.

Figure 7:
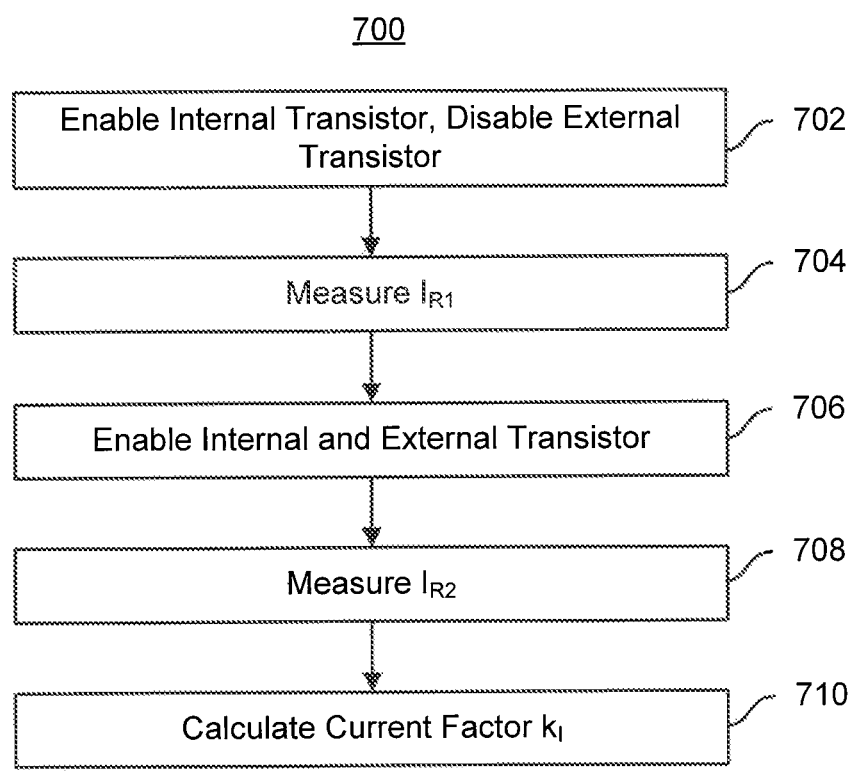
FIG. 7 is a flow chart that illustrates a method of measuring current according to embodiments of the disclosure.
Figure 8:
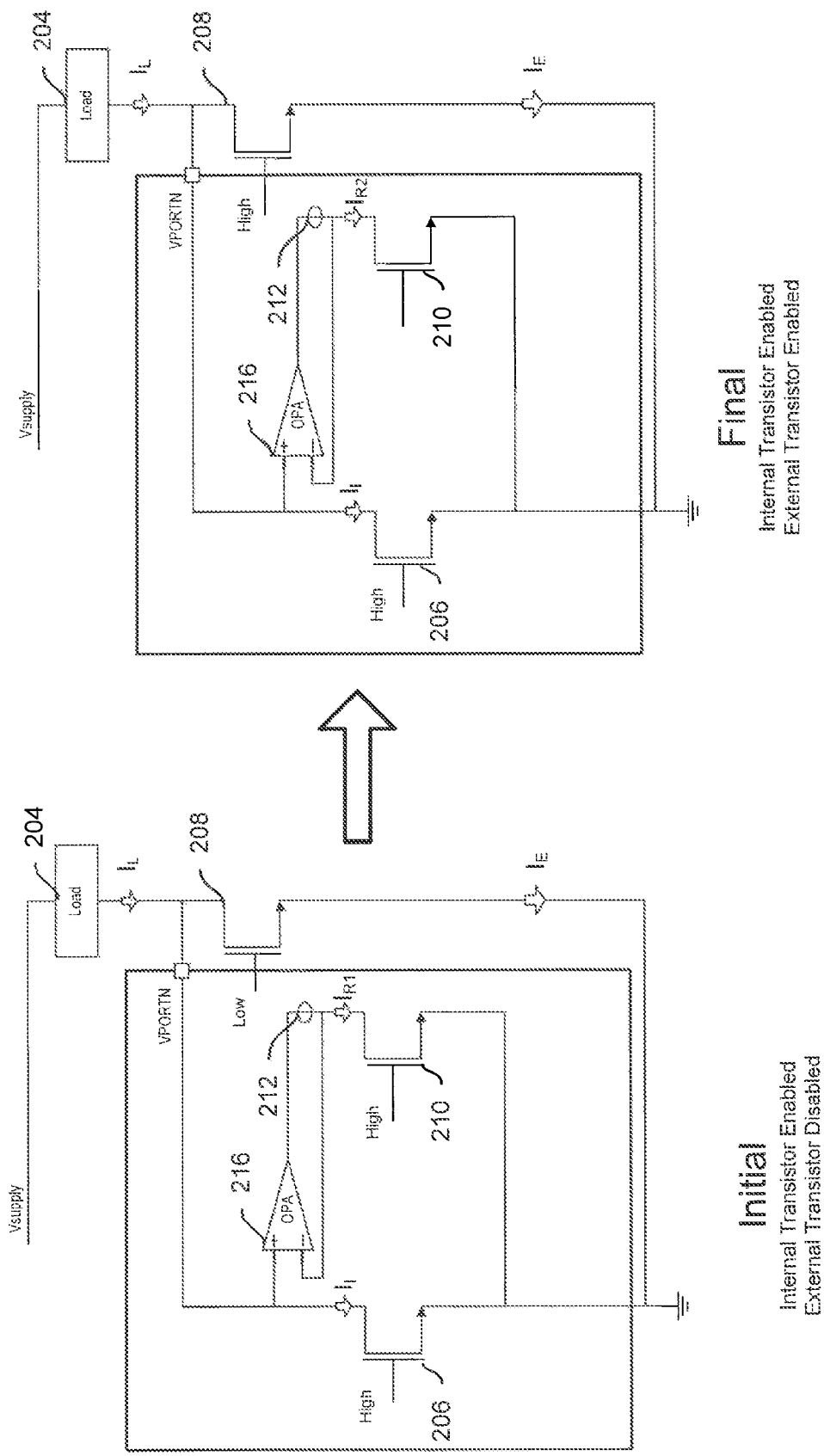
FIG. 8 is a diagram of the states of various circuit components as they operate according to embodiments of the disclosure.

FIG. 7 depicts a method 700 for measuring current according to embodiments of the disclosure. Method 700 differs from methods 300 and 500 in that it uses different initial and final states to indirectly measure the load current $I_L$. FIG. 8 depicts the state of various components in a hybrid PoE system as it performs the method 700 according to embodiments of the disclosure.

According to method 700, the controller 2208 enables internal transistor 206 and disables the external transistor 208 at step 702. The initial-state current $I_{R1}$ at current measurement node 212 can then be measured at step 704. Next, at step 706, the external transistor 208 is enabled. At step 708, an final-state current $I_{R2}$ can be measured. And at step 710, the current factor $k_I$ can be calculated according to equation 2, above.

Figure 9:
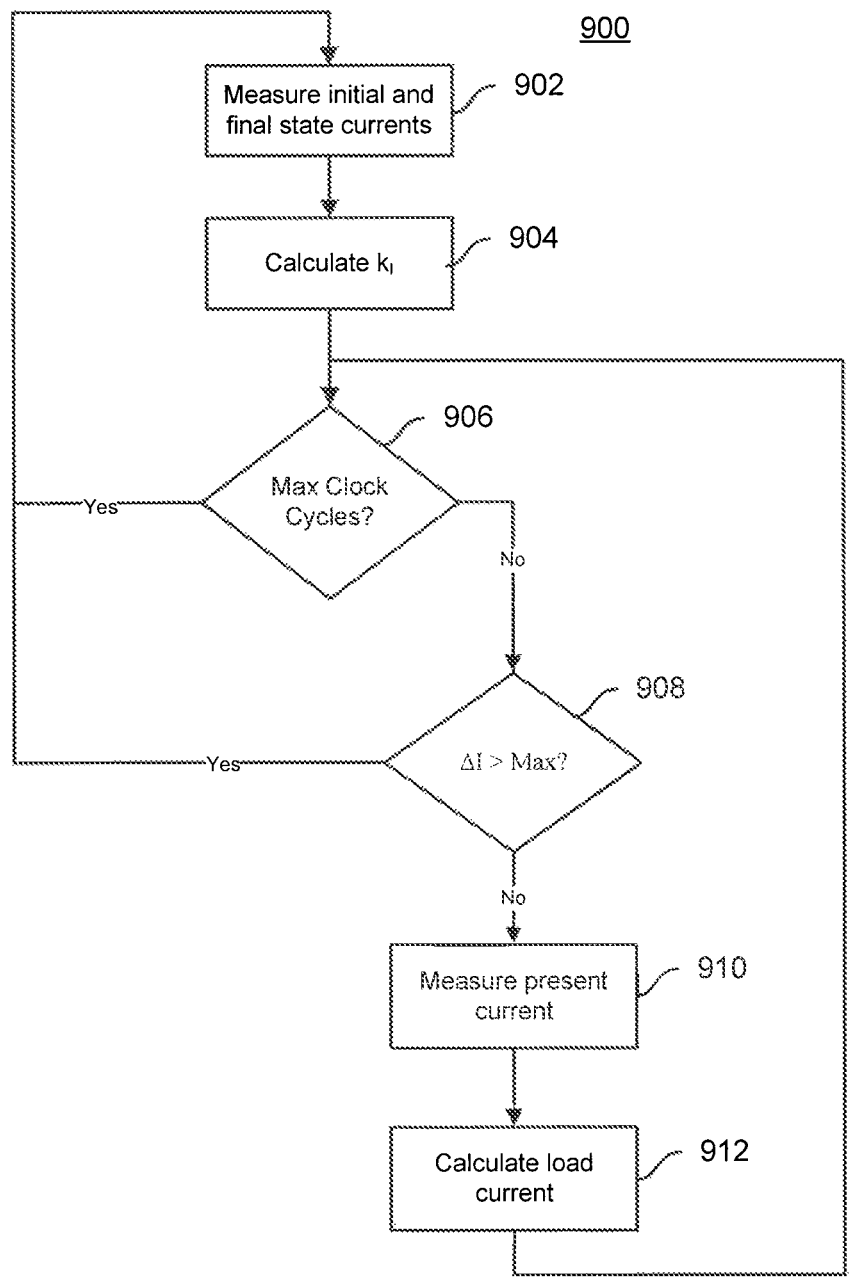
FIG. 9 is a flow chart that illustrates a method of measuring current according to embodiments of the disclosure.

According to embodiments of the disclosure, it is advantageous to continuously measure the current in the PoE system load. This current measurement can be performed, for instance, every clock cycle according to some embodiments. Alternatively, it can occur after a pre-determined amount of time has occurred. FIG. 9 depicts a method 900 of continuously measuring the current according to embodiments of the disclosure.

As shown in FIG. 9, initial and final currents are measured at step 902 using one of methods 300, 500, or 700. Accordingly, what is being measured at this point is $I_{R1}$ and $I_{R2}$ according to one of the methods discussed above. It should be noted that each of methods 300, 500 and 700 has associated advantages and disadvantages. For instance, method 300 minimizes power dissipation in the IC and allows an arbitrary decrease in the power consumption by decreasing the duty cycle of the internal transistor, but tracks thermal transients slowly. Method 500 has the advantage of high measurement accuracy, but tacks thermal transients more slowly. Method 700 utilizes the least overall system power, but does not minimize power dissipation in the integrated circuit. Accordingly, based on the particular application for which the PoE system is being used, the appropriate method of measuring the current can be selected.

Once the initial and final state currents $I_{R1}$ and $I_{R2}$ have been measured they can be used to calculate the current factor $k_I$ at step 904. Current factor $k_I$ will later be used to calculate the load current at any given time. According to embodiments of the disclosure, the current factor $k_I$ is calculated according to equation 1 for if method 300 is used or according to equation 2 if methods 500 or 700 are used.

At step 906, the method determines whether a predetermined number of clock cycles has been reached or whether a time limit has been reached. According to some embodiments, this can take the form of a cycle counter. If the maximum time or clock cycles has been reached, then the method loops back to step 902. If, however, the maximum number of clock cycles has not been reached, then the method determines whether the difference between the present value of the current and the initially calculated current value (i.e., ΔI) is greater than a pre-determined maximum at step 908. According to embodiments of the disclosure, the order of steps 906 and 908 can be alternated. f, at step 908 the method determines that the maximum ΔI has been reached, then the method loops back to step 902 and an initial current is measured again. If, however, the method determines that the maximum Al has not been reached, then the present current $I_{RP}$ at the measurement node 212 is measured at step 910 and the present value of the system current can be calculated at step 912. The present current $I_{RP}$ can be measured while the PoE system remains in the "final-state" according to the methods 300, 500, or 700. The IRP may also be measured while the PoE system is in another state according to other embodiments. According to embodiments, the present system current $I_L$ can be calculated according to equation 3.

$$I_L = kI^* I_{RP} \qquad \text{Eq. 3}$$

After calculating the present value of the load current $I_L$ at step 912, the method 900 loops back to step 906.

The representative controller functions described herein can be implemented in hardware, software, or some combination thereof. For instance, the controller functions can be implemented using computer processors, computer logic, application specific circuits (ASIC), state machines, etc. as will be understood by those skilled in the arts based on the discussion given herein. Accordingly, any processor that performs the controller functions described herein is within the scope and spirit of the present disclosure.

Further, the controller functions described herein could be embodied by computer program instructions that are executed by a computer processor or any one of the hardware devices listed above. The computer program instructions cause the processor to perform the controller functions described herein. The computer program instructions (e.g. software) can be stored in a computer usable medium, computer program medium, or any storage medium that can be accessed by a computer or processor. Such media include a memory device such as a RAM or ROM, or other type of computer storage medium such as a computer disk or CD ROM, or the equivalent. Accordingly, any computer storage medium having computer program code that cause a processor to perform the controller functions described herein are within the scope and spirit of the present disclosure.

CONCLUSION

It is to be appreciated that the Detailed Description and not the Abstract, is intended to be used to interpret the claims. The Abstract may set forth one or more, but not all exemplary embodiments of the disclosure, and thus, are not intended to limit the appended claims in any way.

The disclosure has been described above with the aid of functional building blocks illustrating the implementation of specified functions and relationships thereof, The boundaries of these functional building blocks have been arbitrarily defined herein for the convenience of the description. Alternate boundaries may be defined so long as the specified functions and relationships thereof are appropriately performed.

It will be apparent to those skilled in the relevant art(s) that various changes in form and detail can be made therein without departing from the spirit and scope of the invention. Thus the invention should not be limited by any of the above-described exemplary embodiments, but should be defined only in accordance with the following claims and their equivalents

What is claimed is:

1. A method of indirectly measuring a load current $I_L$ in a power over Ethernet (PoE) system that includes a first transistor, a second transistor, and a replica transistor M times smaller than at least one of the first and second transistors, the method comprising:
   enabling both the first and second transistors and measuring an initial-state current $I_{R1}$ through the replica transistor;
   disabling at least one of the first and second transistors and measuring a final-state current $I_{R2}$ through the replica transistor;
   calculating a current factor $k_I$ based on the initial-state current $I_{R1}$ and the final-state current $I_{R2}$; and
   calculating the load current $I_L$ based on a measured present current $I_{RP}$ in the replica transistor and the current factor $k_I$.

2. The method of claim 1, wherein the current factor $k_I$ is calculated according to the following equation:

$$k_I = M * \frac{I_{R1}}{I_{R2} - I_{R1}}. \qquad \text{Equation 1}$$

3. The method of claim 1, wherein the load current $I_L$ is calculated according to the following equation:

$$I_L = k_I * I_{RP}.$$

4. The method of claim 1, further comprising:
repeating the step of calculating the load current $I_L$ until a difference between an initial load current $I_{LO}$ and the load current $I_L$ is greater than or equal to a predetermined value; and
repeating the steps of enabling, disabling, and calculating the current factor $k_I$.

5. The method of claim 1, further comprising:
repeating the step of calculating the load current $I_L$ until a predetermined number of cycles has elapsed; and
repeating the steps of enabling, disabling, and calculating the current factor $K_I$.

6. The method of claim 1, further comprising:
repeating the step of calculating the load current $I_L$ until a predetermined amount of time has elapsed; and
repeating the steps of enabling, disabling, and calculating the current factor $K_I$.

7. The method of claim 1, wherein the PoE system comprises an integrated circuit component and an external component and wherein the first transistor and the replica transistor form part of the integrated circuit component and the second transistor forms part of the external component.

8. The method of claim 1, wherein the replica transistor has a larger resistance than both the first and second transistors.

9. The method of claim 1, wherein at least one of corresponding gate voltages, corresponding drain voltages, or corresponding source voltages are the same for the first transistor and the replica transistor.

10. A power over Ethernet (PoE) system, comprising:
an integrated circuit component that includes a controller, a first transistor, and a replica transistor, wherein the first transistor is coupled between a load and a ground; and
a second transistor directly coupled between the load and the ground, wherein the second transistor is external to the integrated circuit component,
wherein the controller is configured to: enable the first and second transistors prior to measuring an initial-state current $I_{R1}$ through the replica transistor, disable at least one of the first and second transistors and measure a final-state current $I_{R2}$ through the replica transistor, calculate a current factor $k_I$ based on the initial-state current $I_{R1}$ and the final-state current $I_{R2}$, and calculate a load current $I_L$ based on a measured present current $I_{RP}$ in the replica transistor and the current factor $k_I$.

11. The system of claim 10, wherein the current factor $k_I$ is calculated according to the following equation:

$$k_I = M * \frac{I_{R1}}{I_{R2} - I_{R1}}. \qquad \text{Equation 1}$$

12. The system of claim 10, wherein the controller is further configured to calculate the load current $I_L$ according to the following equation:

$$I_L = k_I * I_{RP}.$$

13. The system of claim 10, wherein the controller is further configured to re-measure the present current $I_{RP}$ through the replica transistor and re-calculate the load current $I_L$ until a difference between an initial load current $I_{LO}$ and the load current $I_L$ is greater than or equal to a predetermined value, and then to re-enable at least one of the first and second transistors and re-measure the initial-state current $I_{R1}$ through the replica transistor, re-disable at least one of the first and second transistors and re-measure the final-state current $I_{R2}$ through the replica transistor, and re-calculate the current factor $k_I$ based on the re-measured initial-state and final-state currents.

14. The system of claim 10, wherein the controller is further configured to re-measure the present current $I_{RP}$ through the replica transistor and re-calculate the load current $I_L$ until a predetermined number of cycles has elapsed, and then to re-enable at least one of the first and second transistors and re-measure the initial-state current $I_{R1}$ through the replica transistor, re-disable at least one of the first and second transistors and re-measure the final-state current $I_{R2}$ through the replica transistor, and re-calculate the current factor $k_I$ based on the re-measured initial-state and final-state currents.

15. The system of claim 10, wherein the controller is further configured to re-measure the present current $I_{RP}$ through the replica transistor and re-calculate the load current $I_L$ until a predetermined amount of time has elapsed, and then to re-enable at least one of the first and second transistors and re-measure the initial-state current $I_{R1}$ through the replica transistor, re-disable at least one of the first and second transistors and re-measure the final-state current $I_{R2}$ through the replica transistor, and re-calculate the current factor $k_I$ based on the re-measured initial-state and final-state currents.

16. The system of claim 10, wherein the replica transistor has a larger resistance than both the first and second transistors.

17. The system of claim 10, wherein the integrated circuit component further comprises a voltage replicator circuit coupled between the first transistor and the replica transistor and configured to replicate a voltage at input terminals of the first and second transistors at an input terminal of the replica transistor.

* * * * *